(12) United States Patent
Mondal et al.

(10) Patent No.: US 6,922,649 B2
(45) Date of Patent: Jul. 26, 2005

(54) MULTIPLE ON-CHIP TEST RUNS AND REPAIRS FOR MEMORIES

(75) Inventors: Krishnendu Mondal, Burlington, VT (US); Michael R. Ouellette, Westford, VT (US)

(73) Assignee: International Business Machines Corporation, Armonk, NY (US)

( * ) Notice: Subject to any disclaimer, the term of this patent is extended or adjusted under 35 U.S.C. 154(b) by 59 days.

(21) Appl. No.: 10/721,561

(22) Filed: Nov. 25, 2003

(65) Prior Publication Data

US 2005/0138513 A1 Jun. 23, 2005

(51) Int. Cl.[7] .......................... G06F 19/00; G11C 7/00
(52) U.S. Cl. .................................. 702/117; 365/225.7
(58) Field of Search ................ 702/117; 365/225.7, 365/201; 714/733, 7, 30

(56) References Cited

U.S. PATENT DOCUMENTS

| | | | |
|---|---|---|---|
| 5,659,551 A | 8/1997 | Huott et al. | 714/725 |
| 5,764,878 A | 6/1998 | Kablanian et al. | 714/7 |
| 5,805,789 A | 9/1998 | Huott et al. | 714/7 |
| 5,841,784 A | 11/1998 | Chan et al. | 714/718 |
| 6,073,258 A | 6/2000 | Wheater | 714/718 |
| 6,141,267 A | 10/2000 | Kirihata et al. | 365/200 |
| 6,182,257 B1 | 1/2001 | Gillingham | 714/733 |
| 6,343,366 B1 * | 1/2002 | Okitaka | 714/733 |
| 6,367,042 B1 | 4/2002 | Phan et al. | 714/733 |
| 6,405,331 B1 | 6/2002 | Chien | 714/718 |
| 6,408,401 B1 | 6/2002 | Bhavsar et al. | 714/7 |
| 6,469,949 B1 | 10/2002 | Hsu et al. | 365/225.7 |
| 6,505,324 B1 | 1/2003 | Cowan et al. | 716/4 |
| 6,560,740 B1 | 5/2003 | Zuraski, Jr. et al. | 714/733 |
| 6,574,757 B1 | 6/2003 | Park et al. | 714/710 |
| 6,651,202 B1 * | 11/2003 | Phan | 714/733 |
| 6,667,918 B2 * | 12/2003 | Leader et al. | 365/201 |
| 6,728,916 B2 * | 4/2004 | Chen et al. | 714/733 |

(Continued)

OTHER PUBLICATIONS

Cowan et al., On-Chip Repair and an ATE Independent Fusing Methodology, 2002 IEEE, ITC International Test Conference, pp. 178-186.*

(Continued)

*Primary Examiner*—Bryan Bui
*Assistant Examiner*—Toan M. Le
(74) *Attorney, Agent, or Firm*—Schmeiser, Olsen & Watts; William H. Steinberg

(57) ABSTRACT

A structure and method for performing on-chip test runs and repairs of a memory chip. In the first test run and repair, a BIST circuit obtains the original combined repair solution from a fuse bay on the memory chip, runs the first test run for the memory chip, obtains a first test-run repair solution, and combines the original combined repair solution and the first test-run repair solution to obtain the latest/first combined repair solution. Then, an exclusive-OR gate is used to compare the first combined repair solution and the original combined repair solution to obtain a first new repair solution, which is programmed into the fuses of the fuse bay. As a result, the fuse bay stores the first combined repair solution. In the second test run and repair, a similar process is performed, and so on. As a result, any number of test runs and repairs can be performed on-chip for the memory chip.

20 Claims, 2 Drawing Sheets

U.S. PATENT DOCUMENTS 6,768,694 B2 * 7/2004 Anand et al. ............ 365/225.7
6,829,736 B1 * 12/2004 Marinissen et al. ......... 714/711
6,856,569 B2 * 2/2005 Nelson et al. ........... 365/225.7

OTHER PUBLICATIONS

Schober et al., Memory Built-In Self-Repair Using Redundant Words, 2001 IEEE, ITC International Test Conference, pp. 995-1001.*

Tanabe et al., A 30-ns 64-Mb DRAM With Built-In Self-Test and Self-Repair Function, Nov. 1992, IEEE Journal of Solid-State Circuits, vol. 27, No. 11, pp. 1525-1533.*

Treuer et al., Built-In Self-Diagnosis for Repairable Embedded RAMs, 1993 IEEE, IEEE Design & Test of Computers, pp. 24-33.*

Barth et al., Method to Reduce Chip Yield Loss Due to Fuses Incorrectly Blown, Research Disclosure, May 1990, No. 313, 1 page.

IBM Technical Disclosure Bulletin R. J. Prilik, vol. 30, No. 11, Apr. 1988, Repair Calculation for Random-Access Memory Redundancy Using Built-in Logic and Scannable Latches, pp. 424-425.

* cited by examiner

MULTIPLE ON-CHIP TEST RUNS AND REPAIRS FOR MEMORIES

BACKGROUND OF THE INVENTION

1. Technical Field

The present invention relates to test runs and repairs for memories, and more specifically, to multiple on-chip test runs and repairs for memories.

2. Related Art

Conventional testing of a memory chip involves a plurality of test runs during each of which the memory chip is tested under a different condition (voltage, temperature, etc.) The resulting test-run repair solution for each test run is collected and stored off-line (i.e., outside the memory chip). Once all test-run repair solutions for all test runs have been collected, they are compiled off-chip into a final repair solution which is implemented by programming the fuses on the memory chip. This testing process wastes tester time because the tester has to wait until the final repair solution has been compiled off-chip before proceeding to implementing the final repair solution.

As a result, a design of a memory chip that allows multiple on-chip test runs and repairs is needed. A method is also needed for performing multiple on-chip test runs and repairs for the memory chip.

SUMMARY OF THE INVENTION

The present invention provides a structure, comprising (a) a fuse bay including a fuse array of N fuses, N being an integer; (b) a BIST circuit electrically coupled to the fuse bay; (c) a memory module electrically coupled to the fuse bay and the BIST circuit; and (d) a new repair circuit electrically coupled to the fuse bay and the BIST circuit, wherein the fuse bay is configured to store and shift an original combined repair solution to the BIST circuit, the BIST circuit is configured to (i) perform a first test run on the memory module so as to obtain a first test-run repair solution, and then (ii) combine the first test-run repair solution and the original combined repair solution from the fuse bay so as to obtain a first combined repair solution, the new repair circuit is configured to receive and compare the original combined repair solution and the first combined repair solution to obtain a first new repair solution, and the fuse bay is further configured to program the first new repair solution into the fuses of the fuse array so that the fuse bay stores the first combined repair solution.

The present invention also provides a memory chip, comprising (a) at least a memory module; (b) a fuse register electrically coupled to the memory module; (c) a fuse array electrically coupled to the fuse register, the fuse array including a plurality of fuses; (d) a program register electrically coupled to the fuse array; (e) a fuse controller electrically coupled to the fuse register and the program register; (f) a BIST circuit electrically coupled to the fuse register and the fuse controller; and (g) a new repair circuit electrically coupled to the BIST circuit, the fuse register, and the program register, wherein the fuse array is configured to store an original combined repair solution, the fuse controller is configured to cause the fuse array to send the original combined repair solution to the fuse register, and then cause the fuse register to send the original combined repair solution to the BIST circuit, the BIST circuit is configured to (i) perform a first test run on the memory module so as to obtain a first test-run repair solution, and then (ii) combine the first test-run repair solution and the original combined repair solution so as to obtain a first combined repair solution, the new repair circuit is configured to receive and compare the original combined repair solution and the first combined repair solution to obtain a first new repair solution, and the fuse controller is further configured to cause the program register to receive the first new repair solution from the new repair circuit and then cause the fuse array to program the first new repair solution into its fuses so that the fuse array stores the first combined repair solution.

The present invention provides a method for performing test runs and repairs of a memory module, the method comprising the steps of (a) using a fuse bay, including a fuse array of N fuses, N being an integer, to store and shift an original combined repair solution to a BIST circuit; (b) using the BIST circuit to (i) perform a first test run on the memory module so as to obtain a first test-run repair solution, and then (ii) combine the first test-run repair solution and the original combined repair solution from the fuse bay so as to obtain a first combined repair solution; (c) using a new repair circuit to receive and compare the original combined repair solution and the first combined repair solution to obtain a first new repair solution; and (d) further using the fuse bay to program the first new repair solution into the fuses of the fuse array so that the fuse bay stores the first combined repair solution.

The present invention provides structures for a memory chip for which multiple test runs and repairs can be performed on-chip.

The present invention also provides methods for performing multiple test runs and repairs on the memory chip.

DETAILED DESCRIPTION OF THE INVENTION

Figure 1:
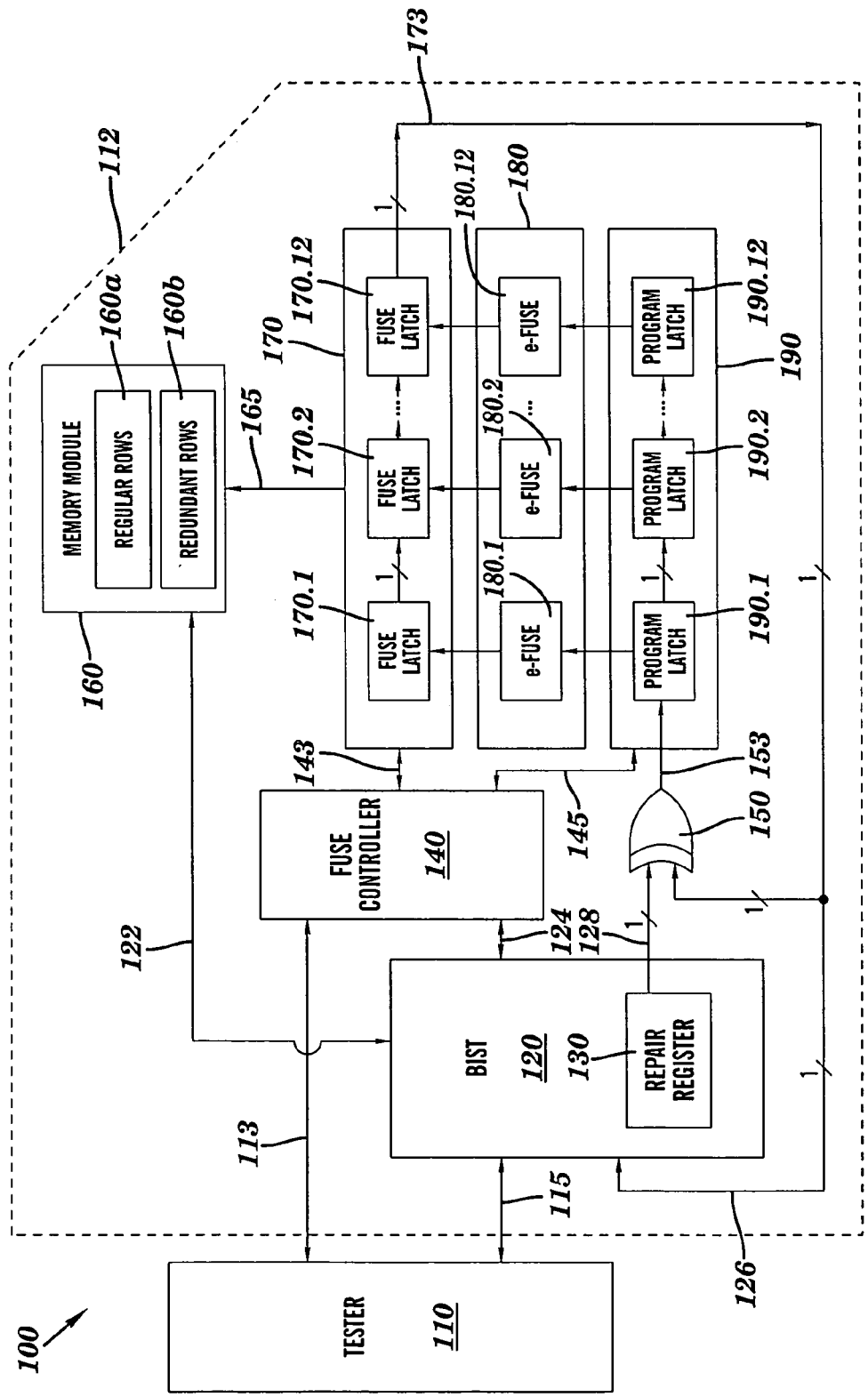
FIG. 1 illustrates a structure comprising a tester and a memory chip configured such that the tester can perform multiple on-chip test runs and repairs for the memory chip, in accordance with embodiments of the present invention.

FIG. 1 illustrates a structure 100 comprising a tester 110 and a memory chip 112 configured such that the tester 110 can perform multiple on-chip test runs and repairs for the memory chip 112, in accordance with embodiments of the present invention. Illustratively, the memory chip 112 comprises a BIST (Built-In Self Test) circuit 120, a fuse controller 140, an exclusive-OR gate 150, a memory module 160, a fuse register 170, a fuse array 180, and a program register 190. The fuse register 170, the fuse array 180, and the program register 190 can be referred to as the fuse bay 170,180,190.

The tester 110 is electrically coupled to the BIST circuit 120 and the fuse controller 140 via connections 115 and 113, respectively. The BIST circuit 120 is also electrically coupled to the fuse controller 140, the memory module 160, and the fuse register 170 via connections 124, 122, and 173, respectively. In one embodiment, the BIST circuit 120 comprises a repair register 130 which is electrically coupled to the exclusive-OR gate 150 via connection 128. In one embodiment, the repair register 130 comprises a chain of latches (not shown) electrically coupled together in series.

The fuse controller 140 is electrically coupled to the fuse register 170 and the program register 190 via connections 143 and 145, respectively. The exclusive-OR gate 150 is electrically coupled to the fuse register 170 via connection 173 and to the program register 190 via connection 153.

The memory module 160 is electrically coupled to the fuse register 170 via connection 165. In one embodiment, the memory module 160 comprises regular rows 160a and redundant rows 160b. Each of the redundant rows 160b can be used to replace one defective regular row 160a, if any. Illustratively, there are 32 regular rows (namely, regular rows 0–31) and 2 redundant rows (namely, redundant rows 0–1) in the memory module 160. Hereafter, a number (e.g., 32) by itself is a decimal number, whereas a number followed by symbol "b" (e.g., 1011b) is a binary number.

The fuse register 170 is electrically coupled to the fuse array 180, which is in turn electrically coupled to the program register 190. Illustratively, the fuse register 170 comprises 12 fuse latches 170.1, 170.2, . . . , and 170.12 coupled in series. The fuse array 180 comprises 12 electronic fuses (i.e., e-fuses or electronically blown fuses, which can be blown by an electric current) 180.1, 180.2, . . . , and 180.12 electrically coupled one-to-one (i.e., bitwise) to the fuse latches 170.1, 170.2, . . . , and 170.12, respectively. The program register 190 comprises 12 program latches 190.1, 190.2, . . . , and 190.12 coupled in series. The program latches 190.1, 190.2, . . . , and 190.12 are electrically coupled one-to-one (i.e., bitwise) to the e-fuses 180.1, 180.2, . . . , and 180.12, respectively. In one embodiment, the repair register 130, the fuse register 170, and the program register 190 have the same length (i.e., 12 bits/latches).

Figure 2:
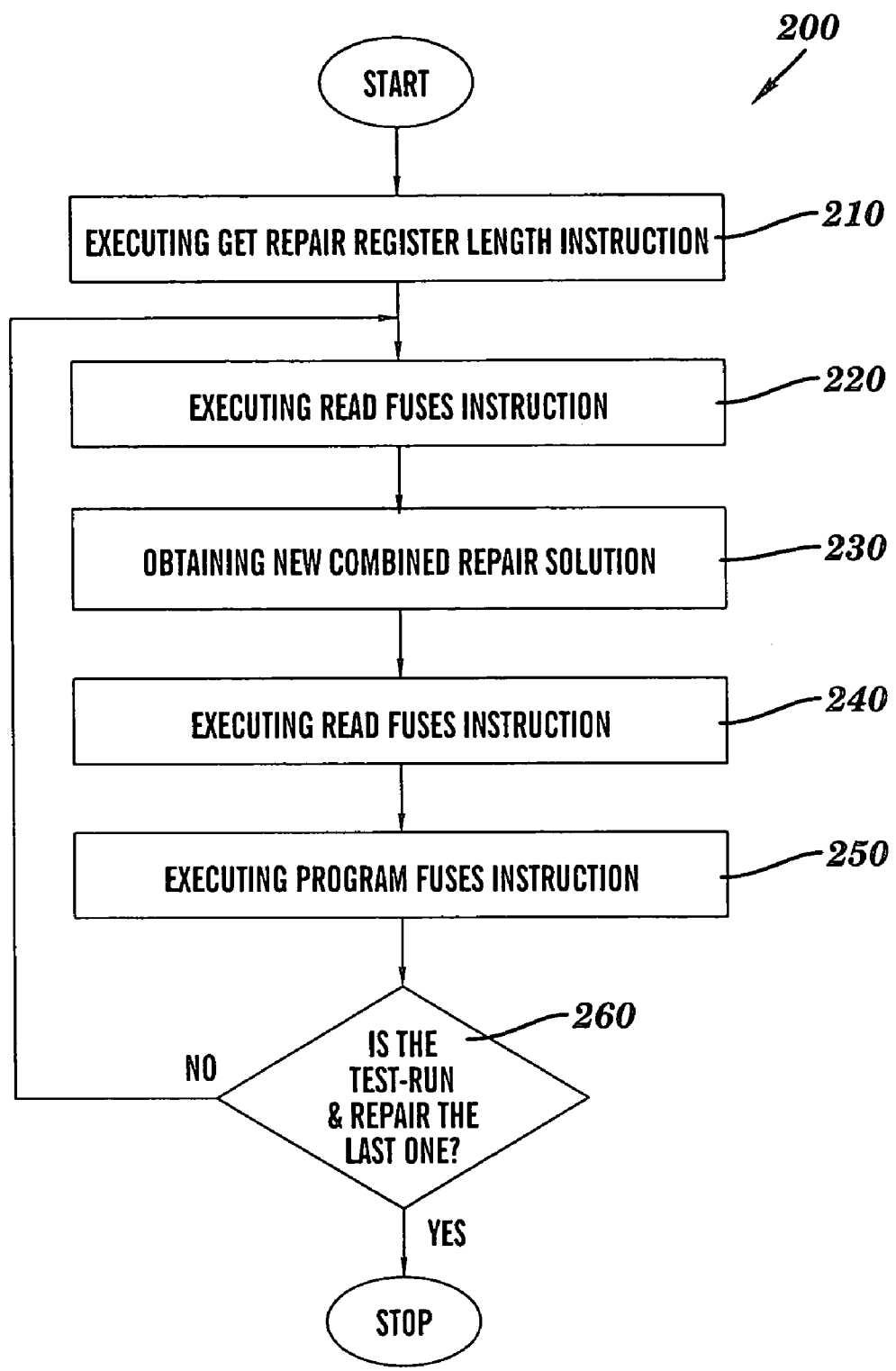
FIG. 2 illustrates a flowchart of a method for performing multiple on-chip test runs and repairs for the memory chip of FIG. 1, in accordance with embodiments of the present invention.

FIG. 2 illustrates a flowchart of a method 200 for performing multiple on-chip test runs and repairs for the memory chip 112 of FIG. 1, in accordance with embodiments of the present invention. As an example of how the structure 100 operates, assume the tester 110 is used to test the memory chip 112. The operation of the structure 100 in this example is described with reference to both FIGS. 1 and 2.

In one embodiment, at Step 210, the tester 110 starts the first test run and repair by issuing a Get Repair Register Length instruction to the fuse controller 140 via connection 113. This instruction is executed only once, and will not be executed again in the following test runs. In response, the fuse controller 140 obtains and stores the length of the repair register 130. In one embodiment, the fuse controller 140 obtains the length of the repair register 130 by initializing the latches of the repair register 130 to 0b, starting a counter (not shown), and causing a 1b to be shifted into one end of the repair register 130. When the 1b exits at the other end of the repair register 130, the count in the counter indicates the length of the repair register 130. As a result, the fuse controller 140 has access to the length of the repair register 130 (which is also the length of the fuse register 170 and the program register 190, and the number of fuses of the fuse array 180) after it executes the Get Repair Register Length instruction. In this example, the length of the repair register 130 is 12 bits.

In one embodiment, after executing the Get Repair Register Length instruction, the fuse controller 140 notifies the tester 110. In response, at Step 220, the tester 110 issues a Read Fuses instruction to the fuse controller 140. In response, the fuse controller 140 causes the content of the fuse array 180 to be read into the fuse register 170. Assume that the memory chip 112 has never been repaired before. As a result, all the e-fuses 180.1–180.12 are intact, and the fuse latch 170.1–170.12 contains 000000 000000b, respectively, after the read. After executing the Read Fuses instruction, the fuse controller 140 notifies the tester 110.

In response, in step 230, a new/first combined repair solution is obtained. More specifically, the tester 110, via connection 115, causes the BIST circuit 120 to test the memory module 160 for the first test run. In response, the BIST circuit 120 first obtains the original combined repair solution. At this point in time, the original combined repair solution is stored in the fuse array 180, which is 00000 000000b, meaning no repair has been done. After the execution of the Read Fuses instruction in the immediately preceding step 220, the fuse register 170 also contains a copy of the original combined repair solution (i.e., 00000 000000b). Therefore, in one embodiment, the BIST circuit 120 can obtain the original combined repair solution by causing the fuse register 170 to shift its content to the BIST circuit 120 via connections 173 and 126. The BIST circuit 120 then tests the memory module 160 under a first condition (e.g., with a certain voltage applied to the memory module). For instance, for each row (regular or redundant), the BIST circuit 120 writes all 1b into the row and then later reads from that row. If the read data is different from the written data, the row is defective. If the read data is the same as the written data, the row is fine with that particular test pattern (all 1b). Then, the BIST circuit 120 moves on to the next row. When done, the BIST circuit 120 records the first test-run repair solution in the repair register 130. More specifically, assume that when the BIST circuit 120 finishes its first test run, it finds only regular row 6 of the 32 regular rows 160a to be defective. The BIST circuit 120 then examines the content of the repair register 130 (which contains the old/original combined repair solution 00000 00000b) and finds that no solution is recorded. As a result, the BIST circuit 120 records the first test-run repair solution (i.e., using redundant row 0 to replace defective regular row 6) in the repair register 130 as 100110 000000b.

The first/left six bits of the repair register 130 are used for redundant row 0 and the right/second six bits of the repair register 130 are used for redundant row 1. In the six bits for redundant row 0 (from left to right), bit 1 (Enabled bit) is 1b indicating that redundant row 0 is enabled (i.e., it is used to replace a defective regular row). Bit 2–6 (Replaced Row Address bits) are 00110b (i.e., 6 in decimal) indicating that the defective row which redundant row 0 replaces is regular row 6.

In the six bits for redundant row 1 (from left to right), bit 1 is 0b indicating that redundant row 1 is not enabled (i.e., redundant row 1 is not used to replace any other row). As a result, the values of bits 2–6 have no significance.

In step 240, the tester 110 again issues the Read Fuses instruction to the fuse controller 140. In response, the fuse controller 140 causes the content of the fuse array 180 to be read into the fuse register 170. As a result, the fuse register 170 again contains the old/original combined repair solution 00000 00000b, which might be erased in the fuse register 170 by the shift in the immediately preceding step 230 (in fact, the shift in step 230 did erase but did not change the old/original combined repair solution because the solution happens to be all 0s).

In Step 250, the tester 110 issues a Program Fuses instruction to the fuse controller 140. In response, the fuse controller 140 causes both the repair register 130 and the fuse register 170 to simultaneously shift their contents serially past the exclusive-OR gate 150 via connections 128 and 173, respectively, into the program register 190 via connection 153. Because the content of the fuse register 170 is all 0b, the content of the repair register 130 passes the exclusive-OR gate 150 unchanged. Because the fuse controller 140 has access to the length of the repair register 130, the fuse controller 140 stops the shifting when all the content of the repair register 130 has been shifted into the program register 190 via connection 153. After the shift, the program latches 190.1–190.12 contain a first new repair solution of 100110 000000b, respectively. Then, the fuse controller 140 initiates the fuse programming process for the first new repair solution. The fuse controller 140 initiates the fuse programming process by first shifting a string of all 0b into the fuse register 170 via connection 143. Then, the fuse controller 140 shifts a 1b through the fuse latches 170.1–170.12 in that order.

The 1b first comes to the fuse latch 170.1 (i.e., the fuse latch 170.1 contains a 1b, the other fuse latches of the fuse register 170 contain a 0b). At the next rising edge of a programming clock (not shown), because the associated program latch 190.1 contains a 1b, a program voltage is applied across the associated e-fuse 180.1. As a result, the e-fuse 180.1 is blown. Therefore, the e-fuse 180.1 contains a 1b.

Then, the 1b moves to the next fuse latch 170.2 (i.e., the fuse latch 170.2 contains a 1b, the other fuse latches of the fuse register 170 contain a 0b). At the next rising edge of the programming clock, because the associated program latch 190.2 contains a 0b, the program voltage is not applied across the associated e-fuse 180.1. As a result, the e-fuse 180.1 is not blown. Therefore, the e-fuse 180.1 contains a 0b.

The programming process continues until the 1b exits the fuse register 170. As a result, after programming, the fuse array 180 has the same content as that of the program register 190 (i.e., 100110 000000b). The fuse array 180 now contains the first/latest combined repair solution.

In one embodiment, after executing the Program Fuses instruction, the fuse controller 140 notifies the tester 110. This point in time marks the completion of the first test run and repair. In response to the notification of the completion of the execution of the first Program Fuses instruction, the tester 110 decides in Step 260 whether the current/first test run and repair is the last one. If so, the method 200 stops. If the answer is negative, the method 200 loops back to Step 220. Assume in this example that the first test run and repair is not the last. As a result, in step 220, the tester 110 again issues the Read Fuses instruction to the fuse controller 140. In response, the fuse controller 140 causes the content of the fuse array 180 to be read into the fuse register 170. As a result, the fuse latch 170.1–170.12 contains 100110 000000b, respectively. Then, the fuse controller 140 notifies the tester 110.

In response to the notification from the fuse controller 140 of the completion of the Read Fuses instruction, in Step 230, a new/second combined repair solution is obtained. More specifically, the tester 110, via connection 115, causes the BIST circuit 120 to test the memory module 160 for a second test run. In response, the BIST circuit 120 first obtains the latest combined repair solution. At this point in time, the first/latest combined repair solution is stored in the fuse array 180, which is 100110 000000b, meaning redundant row 0 is used to replace defective regular row 6, and redundant row 1 is not used. After the execution of the Read Fuses instruction in the immediately preceding step 220, the fuse register 170 also contains a copy of the first/latest combined repair solution (i.e., 100110 000000b). Therefore, the BIST circuit 120 can obtain the latest/first combined repair solution by causing the fuse register 170 to shift its content to the repair register 130 of the BIST circuit 120 via connections 173 and 126. Then, the BIST circuit 120 tests the memory module 160 under a second condition. When done, the BIST circuit 120 records the second test-run repair solution in the repair register 130. More specifically, assume that when the BIST circuit 120 finishes its second test run, it finds only regular row 8 of the 32 regular rows 160a to be defective.

Then, the BIST circuit 120 examines the content of the repair register 130 and recognizes that the redundant row 0 is being used because the first bit of the repair register 130 is 1b. As a result, the BIST circuit 120 records the second test-run repair solution (i.e., using redundant row 1 to replace defective regular row 8) in the last 6 bits of the repair register 130. The repair register 130 now contains the second/latest combined repair solution (i.e., 100110 1000b).

In the six bits of the repair register 130 used for redundant row 0 (from left to right), bit 1 (Enabled bit) is 1b indicating that redundant row 0 is enabled (i.e., it is used to replace a defective regular row). Bit 2–6 (Replaced Row Address bits) are 00110b (i.e., 6 in decimal) indicating that the defective row which redundant row 0 replaces is regular row 6.

In the six bits of the repair register 130 used for redundant row 1 (from left to right), bit 1 (Enabled bit) is 1b indicating that redundant row 1 is enabled (i.e., it is used to replace a defective regular row). Bit 2–6 (Replaced Row Address bits) are 01000b (i.e., 8 in decimal) indicating that the defective row which redundant row 1 replaces is regular row 8.

After that, the BIST circuit 120 notifies the fuse controller 140, which in turn notifies the tester 110. In response, in Step 240, the tester 110 again issues the Read Fuses instruction to the fuse controller 140. In response, the fuse controller 140 causes the content of the fuse array 180 to be read into the fuse register 170. As a result, the fuse register 170 again contains the old/first combined repair solution 100110 000000b, which was erased in the fuse register 170 by the shift in the immediately preceding step 230.

Then, in Step 250, the tester 110 again issues the Program Fuses instruction to the fuse controller 140. In response, the fuse controller 140 causes both the repair register 130 and fuse register 170 to simultaneously shift their contents serially past the exclusive-OR gate 150 via connections 128 and 173, respectively, into the program register 190 via connection 153. Because the contents of the fuse register 170 and the repair register 130 are 100110 000000b and 100110 11000b, respectively, the program latches 190.1–190.12 contain 000000 101000b, respectively, after the shift, which is the additional repair solution (or second new repair solution). Then, the fuse controller 140 initiates the fuse programming process for the second new repair solution in a manner similar to the fuse programming process for the first new repair solution.

After the second new repair, the fuse array 180 has the content 100110 101000b, which reflects the second/latest combined repair solution of the first and second test runs and repairs. Then, the fuse controller 140 notifies the tester 110. This point in time marks the completion of the second test run and repair. Then, the tester 110 decides in Step 260 whether the current/second test run and repair is the last one. If so, the method 200 stops. If the answer is negative, Step 220 is again performed. Assume in this example that the second test run and repair is the last. As a result, the tester 110 stops.

In summary, the two test runs and repairs have been performed on-chip (i.e., on the memory chip 112) and the final repair solution has been implemented in the e-fuses 180.1– 180.12. The final repair solution is compiled on-chip.

As a result, the tester time is not wasted on waiting for the off-chip compilation of a final repair solution.

After the final repair has been implemented, during initialization of the memory chip 112, the content of the fuse array 180 is read into the fuse register 170. As a result, during normal operation of the memory chip 112, whenever the row address of the defective regular row 6 (i.e., 00110b) appears on system address bus (not shown), a comparison between that address and the contents of the fuse latches 170.2–170.6 results in a match. As a result, a signal is generated that disables defective regular row 6 and enables redundant row 0. In other words, redundant row 0 is accessed instead of defective regular row 6.

Similarly, whenever the row address of the defective regular row 8 (i.e., 01000b) appears on the address bus, a comparison between that address and the contents of the fuse latches 170.8–170.12 results in a match. As a result, a signal is generated that disables defective regular row 8 and enables redundant row 1. In other words, redundant row 1 is accessed instead of defective regular row 8.

In the embodiments described above, two test runs and repairs are performed. In general, any number of test runs and repairs can be performed in a similar manner.

In the embodiments described above, the repair register 130, the fuse register 170, the fuse array 180, and the program register 190 all have 12 bits. In general, these components can have any number of bits (i.e., any length).

In the embodiments described above, the number of regular rows is 32 and the number of redundant rows is 2. In general, any numbers of redundant and regular rows can be used.

In the embodiments described above, the memory chip 112 has only one memory module 160. In general, the memory chip 112 can have any number of memory modules having connections similar to that of the memory module 160.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. A structure, comprising:
   a fuse bay including a fuse array of N fuses, N being an integer;
   a built-in-self-test (BIST) circuit electrically coupled to the fuse bay;
   a memory module electrically coupled to the fuse bay and the BIST circuit; and
   a new repair circuit electrically coupled to the fuse bay and the BIST circuit, wherein
   the fuse bay is configured to store and shift an original combined repair solution to the BIST circuit;
   the BIST circuit is configured to (i) perform a first test run on the memory module so as to obtain a first test-run repair solution, and then (ii) combine the first test-run repair solution and the original combined repair solution from the fuse bay so as to obtain a first combined repair solution;
   the new repair circuit is configured to receive and compare the original combined repair solution and the first combined repair solution to obtain a first new repair solution; and
   the fuse bay is further configured to program the first new repair solution into the fuses of the fuse array so that the fuse bay stores the first combined repair solution.

2. The structure of claim 1, wherein
   the fuse bay is further configured to shift the first combined repair solution to the BIST circuit,
   the BIST circuit is further configured to (i) perform a second test run on the memory module so as to obtain a second test-run repair solution, and then (ii) combine the second test-run repair solution and the first combined repair solution from the fuse bay so as to obtain a second combined repair solution,
   the new repair circuit is further configured to receive and compare the first combined repair solution and the second combined repair solution to obtain a second new repair solution, and
   the fuse bay is further configured to program the second new repair solution into the fuses of the fuse array so that the fuse bay stores the second combined repair solution.

3. The structure of claim 1, wherein the fuse bay further comprises a fuse register including N fuse latches electrically coupled one-by-one to the N fuses of the fuse array, wherein the fuse register is configured to obtain a copy of a content of the fuse array.

4. The structure of claim 1, wherein the fuse bay further comprises a program register including N program latches electrically coupled one-by-one to the N fuses of the fuse array, wherein the program register is configured to store a content to be programmed into the fuse array.

5. The structure of claim 1, wherein the new repair circuit comprises an exclusive-OR gate.

6. The structure of claim 1, wherein the BIST circuit comprises a repair register of N bits configured to store one of the repair solutions at a time.

7. The structure of claim 1, wherein the number of fuses of the fuse array equals the length in bits of the first test-run repair solution.

8. The structure of claim 1, wherein the fuses are electronically blown fuses.

9. A memory chip, comprising:
   at least a memory module;
   a fuse register electrically coupled to the memory module;
   a fuse array electrically coupled to the fuse register, the fuse array including a plurality of fuses;
   a program register electrically coupled to the fuse array;
   a fuse controller electrically coupled to the fuse register and the program register;
   a built-in-self-test (BIST) circuit electrically coupled to the fuse register and the fuse controller; and
   a new repair circuit electrically coupled to the BIST circuit, the fuse register, and the program register; wherein
   the fuse array is configured to store an original combined repair solution;
   the fuse controller is configured to cause the fuse array to send the original combined repair solution to the fuse register, and then cause the fuse register to send the original combined repair solution to the BIST circuit;
   the BIST circuit is configured to (i) perform a first test run on the memory module so as to obtain a first test-run repair solution, and then (ii) combine the first test-run repair solution and the original combined repair solution so as to obtain a first combined repair solution;
   the new repair circuit is configured to receive and compare the original combined repair solution and the first combined repair solution to obtain a first new repair solution; and
   the fuse controller is further configured to cause the program register to receive the first new repair solution from the new repair circuit and then cause the fuse array to program the first new repair solution into its fuses so that the fuse array stores the first combined repair solution.

10. The structure of claim 9, wherein
the fuse controller is further configured to cause the fuse array to send the first combined repair solution to the fuse register, and then cause the fuse register to send the first combined repair solution to the BIST circuit,
the BIST circuit is further configured to (i) perform a second test run on the memory module so as to obtain a second test-run repair solution, and then (ii) combine the second test-run repair solution and the first combined repair solution so as to obtain a second combined repair solution,
the new repair circuit is further configured to receive and compare the first combined repair solution and the second combined repair solution to obtain a second new repair solution, and
the fuse controller is further configured to cause the program register to receive the second new repair solution from the new repair circuit and then cause the fuse array to program the second new repair solution into its fuses so that the fuse array stores the second combined repair solution.

11. The structure of claim 9, wherein the new repair circuit comprises an exclusive-OR gate.

12. The structure of claim 9, wherein the fuses are electronically blown fuses.

13. A method for performing test runs and repairs of a memory module, the method comprising the steps of:
using a fuse bay, including a fuse array of N fuses, N being an integer, to store and shift an original combined repair solution to a built-in-self-test (BIST) circuit;
using the BIST circuit to (i) perform a first test run on the memory module so as to obtain a first test-run repair solution, and then (ii) combine the first test-run repair solution and the original combined repair solution from the fuse bay so as to obtain a first combined repair solution;
using a new repair circuit to receive and compare the original combined repair solution and the first combined repair solution to obtain a first new repair solution; and
further using the fuse bay to program the first new repair solution into the fuses of the fuse array so that the fuse bay stores the first combined repair solution.

14. The method of claim 13, further comprising the steps of:
using the fuse bay to shift the first combined repair solution to the BIST circuit;
using the BIST circuit to (i) perform a second test run on the memory module so as to obtain a second test-run repair solution, and then (ii) combine the second test-run repair solution and the first combined repair solution from the fuse bay so as to obtain a second combined repair solution;
using the new repair circuit to receive and compare the first combined repair solution and the second combined repair solution to obtain a second new repair solution; and
using the fuse bay to program the second new repair solution into the fuses of the fuse array so that the fuse bay stores the second combined repair solution.

15. The method of claim 13, wherein the step of using the fuse array to store and shift the original combined repair solution to the BIST circuit comprises the steps of:
providing in the fuse bay a fuse register including N fuse latches electrically coupled one-by-one to the N fuses of the fuse array; and
using the fuse register to obtain a copy of a content of the fuse array.

16. The method of claim 13, wherein the step of using the fuse bay to program the first new repair solution into the fuses of the fuse array comprises the steps of:
providing in the fuse bay a program register including N program latches electrically coupled one-by-one to the N fuses of the fuse array; and
using the program register to receive the first new repair solution from the new repair circuit.

17. The method of claim 13, wherein the new repair circuit comprises an exclusive-OR gate.

18. The method of claim 13, wherein the step of using the BIST circuit to perform the first test run on the memory module so as to obtain the first test-run repair solution comprises the steps of:
providing a repair register of N bits; and
using the repair register to store the first test-run repair solution.

19. The method of claim 13, wherein the number of fuses of the fuse array equals the length in bits of the first test-run repair solution.

20. The method of claim 13, wherein the fuses are electronically blown fuses.

* * * * *